(12) United States Patent
Rogers

(10) Patent No.: US 9,482,714 B2
(45) Date of Patent: Nov. 1, 2016

(54) SYSTEMS AND METHODS FOR OVERHEAT DETECTION SYSTEM EVENT LOCATION

(71) Applicant: Kidde Technologies, Inc., Wilson, NC (US)

(72) Inventor: Aaron Stanley Rogers, Wilson, NC (US)

(73) Assignee: KIDDE TECHNOLOGIES, INC., Wilson, NC (US)

( * ) Notice: Subject to any disclaimer, the term of this patent is extended or adjusted under 35 U.S.C. 154(b) by 647 days.

(21) Appl. No.: 13/909,706

(22) Filed: Jun. 4, 2013

(65) Prior Publication Data

US 2014/0358455 A1 Dec. 4, 2014

(51) Int. Cl.
| | |
|---|---|
| *G01R 31/08* | (2006.01) |
| *G01K 3/00* | (2006.01) |
| *G08B 17/06* | (2006.01) |
| *G01K 3/14* | (2006.01) |

(52) U.S. Cl.
CPC ............. *G01R 31/088* (2013.01); *G01K 3/005* (2013.01); *G01K 2003/145* (2013.01); *G08B 17/06* (2013.01)

(58) Field of Classification Search
CPC ........... G01K 2003/145; G01K 3/005; G01R 31/088; G08B 17/06; G08B 13/00
USPC ...... 702/59, 64, 65, 118, 132; 340/508, 584, 340/596, 506, 511; 376/247
See application file for complete search history.

(56) References Cited

U.S. PATENT DOCUMENTS

| | | | |
|---|---|---|---|
| 4,388,267 A | | 6/1983 | Tokarz |
| 4,435,700 A | * | 3/1984 | Alley ..................... G08B 13/00 340/506 |
| 5,412,374 A | | 5/1995 | Clinton |
| 5,793,293 A | | 8/1998 | Melamud |

FOREIGN PATENT DOCUMENTS

GB            1013799 A      12/1965

OTHER PUBLICATIONS

European Search Report for Application No. EP 144 17 1166, Mailed on Oct. 8, 2014, 8 Pages.

* cited by examiner

*Primary Examiner* — John H Le
(74) *Attorney, Agent, or Firm* — Cantor Colburn LLP

(57) ABSTRACT

Embodiments relate to systems for improved relative location identification for overheat, short circuit, and open circuit events. The systems accomplish the improvements by utilizing any, or a combination, of implementing a novel calculation formula, determining and implementing an external offset value, and determining and implementing an internal offset value.

21 Claims, 1 Drawing Sheet

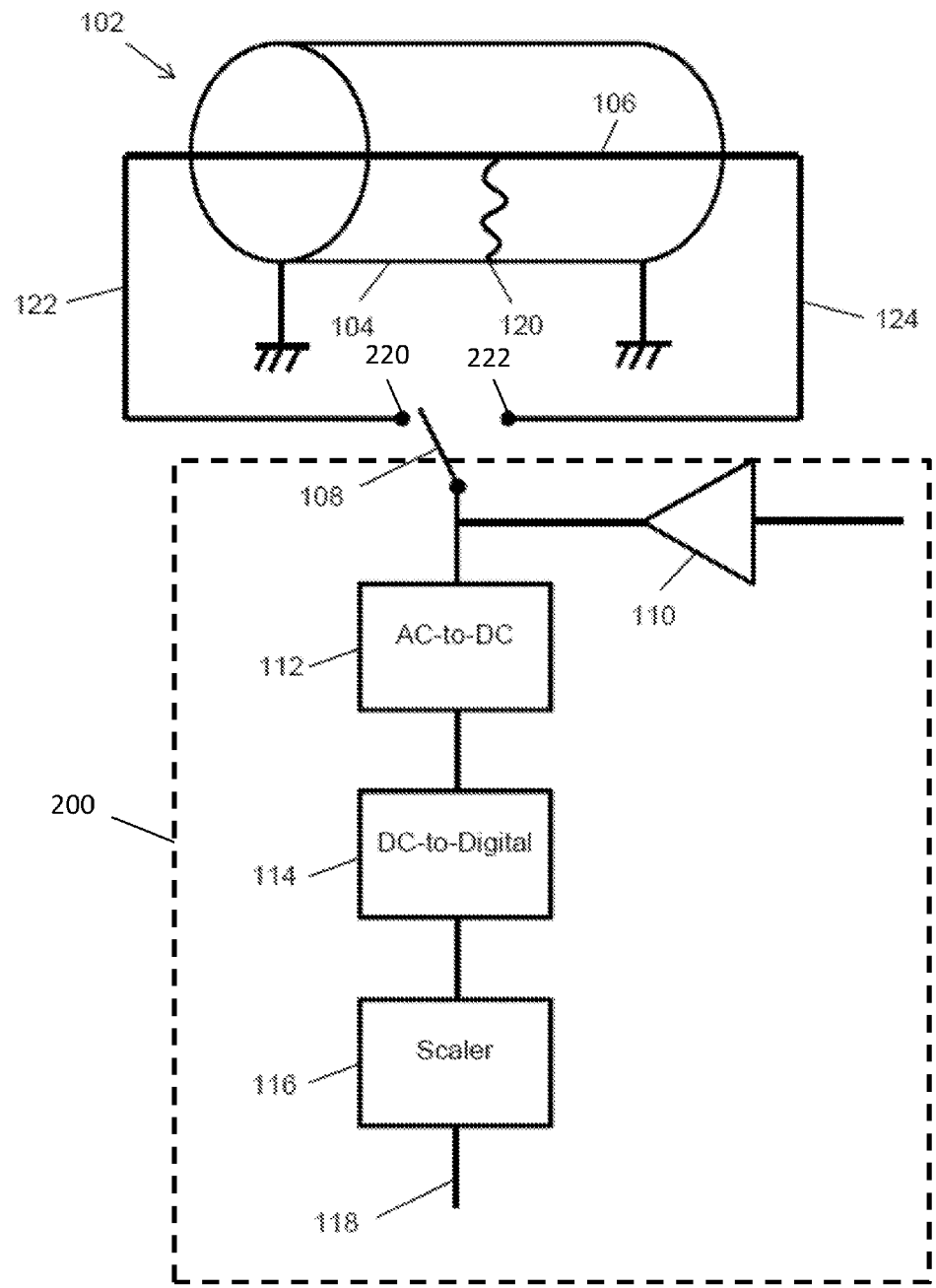

SYSTEMS AND METHODS FOR OVERHEAT DETECTION SYSTEM EVENT LOCATION

SUMMARY

According to various embodiments, a system is disclosed. The system includes a sensing element comprising an inner wire, a conductive outer tube, and a filler interposed between the inner wire and the conductive outer tube, where an electrical resistance of the filler lowers at a temperature indicative of an overheat event, where the sensing element includes at least one of a loop start electrical connector and a loop end electrical connector, and an electronic controller including at least one of a loop start port and a loop end port, the electronic controller configured to electrically connect to at least one of the loop start electrical connector and to the loop end electrical connector, the electronic controller including at least one nonvolatile memory configured to store an internal offset value indicative of an error due to internal controller circuitry variances for at least one of a loop start reading and a loop end reading, where the electronic controller is configured to determine a relative location of an event in the sensing element using the internal offset value and the formula $\frac{1}{2}[V_s/(V_s+V_e)+(1-V_e/(V_s+V_e))]$, where $V_s$ represents a voltage detected across a loop start location and $V_e$ represents a voltage detected across a loop end location.

Various optional features of the above embodiments include the following. The at least one nonvolatile memory can be configured to store a drive value associated with the sensing element, where the electronic controller is configured to provide to the sensing element a drive current having an amperage based on the drive value. The electronic controller can be configured to determine an external offset value indicative of an error due to external circuitry variances for at least one of an induced loop start event and an induced loop end event, where the electronic controller is further configured to determine a relative location of an event in the sensing element using the external offset value. The system can include a plurality of sensing elements connectable in series. The system can be installed in an aircraft. The system can be further configured to report overheat events, short circuit events, and open circuit events. The electronic controller can further include a loop start port, a loop end port, and a multiplexer coupled to the loop start port and loop end port.

According to various embodiments, a system is disclosed. The system includes a sensing element comprising an inner wire, a conductive outer tube, and a filler interposed between the inner wire and the conductive outer tube, where an electrical resistance of the filler lowers at a temperature indicative of an overheat event, where the sensing element includes at least one of a loop start electrical connector and a loop end electrical connector, and an electronic controller including at least one of a loop start port and a loop end port, the electronic controller configured to electrically connect to at least one of the loop start electrical connector and to the loop end electrical connector, the electronic controller including at least one nonvolatile memory configured to store a drive value associated with the sensing element, where the electronic controller is configured to provide to the sensing element a drive current having an amperage based on the drive value, where the electronic controller is configured to determine a relative location of an event in the sensing element using the formula $\frac{1}{2}[V_s/(V_s+V_e)+(1-V_e/(V_s+V_e))]$, where $V_s$ represents a voltage detected across a loop start location and $V_e$ represents a voltage detected across a loop end location.

Various optional features of the above embodiments include the following. The at least one nonvolatile memory can be configured to store an external offset value indicative of an error due to external circuitry variances for at least one of an induced loop start event and an induced loop end event, where the electronic controller is configured to determine a relative location of an event in the sensing element using the external offset value. The electronic controller can be configured to store an internal offset value indicative of an error due to internal controller circuitry variances for at least one of a loop start reading and a loop end reading, where the electronic controller is further configured to determine a relative location of an event in the sensing element using the internal offset value. The system can further include a plurality of sensing elements connectable in series. The system can be installed in an aircraft. The system can be further configured to report overheat events, short circuit events, and open circuit events. The electronic controller can further include a loop start port, a loop end port, and a multiplexer coupled to the loop start port and loop end port.

According to various embodiments, a system is disclosed. The system includes a sensing element comprising an inner wire, a conductive outer tube, and a filler interposed between the inner wire and the conductive outer tube, where an electrical resistance of the filler lowers at a temperature indicative of an overheat event, where the sensing element includes at least one of a loop start electrical connector and a loop end electrical connector, and an electronic controller including at least one of a loop start port and a loop end port, the electronic controller configured to electrically connect to at least one of the loop start electrical connector and to the loop end electrical connector, the electronic controller comprising at least one nonvolatile memory configured to store a drive value associated with the sensing element and an internal offset value indicative of an error due to internal controller circuitry variances for at least one of a loop start reading and a loop end reading, where the electronic controller is configured to provide to the sensing element a drive current having an amperage based on the drive value, wherein the electronic controller is configured to determine a relative location of an event in the sensing element using the internal offset value.

Various optional features of the above embodiments include the following. The at least one nonvolatile memory can be configured to store an external offset value indicative of an error due to external circuitry variances for at least one of an induced loop start event and an induced loop end event, where the electronic controller is further configured to determine a relative location of an event in the sensing element using the external offset value. The electronic controller can be further configured to determine a relative location of an event in the sensing element using to internal offset value, the external offset value, and the formula $\frac{1}{2}[V_s/(V_s+V_e)+(1-V_e/(V_s+V_e))]$, where $V_s$ represents a voltage detected across a loop start location and $V_e$ represents a voltage detected across a loop end location. The system can further include a plurality of sensing elements connectable in series. The system can be installed in an aircraft. The system can be further configured to report overheat events, short circuit events, and open circuit events. The electronic controller can further include a loop start port, a loop end port, and a multiplexer coupled to the loop start port and loop end port.

DESCRIPTION OF DRAWINGS

The accompanying drawing, which is incorporated in and constitute a part of this specification, illustrates embodiments of the present teachings and together with the description, serves to explain the principles of the present teachings. In particular:

FIG. 1 is a schematic diagram of a system according to various embodiments.

DETAILED DESCRIPTION

Various embodiments of the invention include techniques for improving relative location reporting for overheat, short circuit, and open circuit events in a detection system. The techniques include utilizing a novel formula for determining relative locations, determining and utilizing an offset to account for errors due to internal controller circuitry variations, and determining and utilizing an offset to account for errors due to external installation variances. A detailed explanation follows.

FIG. 1 is a schematic diagram of system according to various embodiments. The system includes sensing element 102. Sensing element 102 includes inner wire 106 and outer tube 104. Inner wire 106 and outer tube 104 can be constructed of a heat-resistant alloy, such as Inconel 625. In some implementations, inner wire 106 is constructed of nichrome, and outer tube 104 is constructed of Inconel 625.

Sensing element 102 can include electrical connectors 122, 124 at one or both ends. The electrical connectors can be configured to permit efficient and robust connection of sensing element 102 to an electronic system. For example, the electrical connectors 122, 124 can be configured such that they individually connect inner wire 106 and outer tube 104.

A thermally sensitive material is interposed between inner wire 106 and outer tube 104. The thermally sensitive material can change resistance when exposed to a sufficiently high temperature. In some embodiments, the thermally sensitive material is an eutectic salt, which melts and conducts electricity when exposed to a sufficiently high temperature. The thermally sensitive material between inner wire 106 and outer tube 104 can include a matrix of crushed glass or ceramic, into which the eutectic salt is drawn.

Sensing element 102 is electrically connected to switch 108 (using, e.g., electrical connectors). In some implementations, sensing element 102 is connected in series to one or more additional sensing elements before being connected to switch 108. Switch 108 can be, for example, an electronic multiplexer capable of multiplexing signals using time divisional multiplexing, for example. Use of a multiplexer can minimize the controller event location design.

Switch 108 is connected to amplifier 110, which amplifies a sinusoidal signal from a signal source and provides the amplified signal to switch 108. The signal can be, for example, 3 KHz at, for example, 6 volts RMS. The gain or current of the signal can be adjusted by a controller to account for different configurations of sensing elements. The signal provided by amplifier 110 is referred to herein as the "loop signal".

Switch 108 is further connected to an input of AC-to-DC converter 112. In some implementations, AC-to-DC converter can include a Wheatstone bridge. An output of AC-to-DC converter 112 is connected to an input of a DC-to-digital converter 114. DC-to-digital converter 114 can convert DC voltage levels to binary representations thereof. In some implementations, DC-to-digital converter 114 converts voltage levels between zero and 5 volts in a linear fashion to an 11-bit binary representation. An output of DC-to-digital converter 114 is connected to an input of scaler 116. Scaler 116 accepts a binary signal from DC-to-digital converter 114 and converts it in a linear fashion to a digitally-represented (e.g., fractional or percentage) value between zero and 100. The output of scaler 116 is provided at output 118. Output 118 can be connected to control logic, e.g., a microcontroller configured to execute the techniques disclosed herein. Output 118 or the control logic can be operably coupled to a display, which can display the occurrence and relative location of short circuit, open circuit and overheat events.

In some implementations, sensing element 102 is connectable to a controller unit 200, with zero or more additional sensing elements connected in series. In such implementations, switch 108, amplifier 110, AC-to-DC converter 112, DC-to-digital converter 114, and scaler 116 can be included in the controller unit 200. The controller unit can include control logic, such as a microcontroller, configured to perform the operations discussed herein. In some embodiments, the controller unit can accommodate multiple loops, each loop including one or more sensing elements. That is, some embodiments include controllers with circuitry sufficient to handle multiple loops. Further, some embodiments provide a loop signal to both a loop start and a loop end, whereas some embodiments provide a loop signal to either of a loop start or a loop end. Thus, the term "loop" encompasses both topological circles and topological line segments.

In operation, the system of FIG. 1 is capable of detecting and providing location information for events occurring at any point along the length of sensing element 102. As used herein, an "event" can be an open circuit, a short circuit, or an overheat. The system of FIG. 1 can be installed in, for example, an aircraft (e.g., in an aircraft wing), a ground vehicle, a marine vehicle, or in a fixed base installation, such as a tunnel or pipeline. In general, the system of FIG. 1 can be installed wherever troubleshooting time and expense warrant a system for detecting event locations.

FIG. 1 additionally schematically depicts overheat event 120. During such an event, inner wire 106 is electrically coupled to outer tube 104 via the thermally sensitive material. Thus, overheat event 120 appears as a short circuit between inner wire 106 and outer tube 104 at a location along the length of sensing element 102. FIG. 1 accordingly schematically depicts overheat event 120 as though inner wire 106 were diverted to touch outer tube 106, although this is not literally the case for an overheat event; instead, at overheat event 120, inner wire 106 is conductively coupled to outer tube 104 through the thermally sensitive material. Nevertheless, overheat events and short circuit events have essentially identical electrical characteristics. Accordingly, some embodiments do no differentiate between overheat events and short circuit events when reporting the detection of such events.

Techniques disclosed herein can detect relative locations of overheat events and short circuit events by determining voltages differences between inner wire 106 and outer tube 104 at both a loop start 220 and a loop end 222 location. "Loop start" and "loop end" locations can be, for example, at avionics rack connectors for the respective controller when the system is installed in an aircraft. As used herein, the term "$V_s$" represents a voltage difference between inner wire 106 and outer tube 104 at a loop start location, and the term "$V_e$" represents a voltage difference between inner wire 106 and outer tube 104 at a loop end location. In some embodiments, the relative location of an overheat event can be determined according to Equation 1:

$$L = \frac{V_s/(V_s + V_e) + (1 - V_e/(V_s + V_e))}{2} \quad (1)$$

In Equation 1, $V_s$ and $V_e$ are as discussed above, and L represents a relative position along a loop of one or more sensing elements at which the event is determined to have occurred. In general, the value of L can be between zero and one, inclusive. The value of L can represent a proportion of the length of such a loop at which the event occurred. For example, a value close to zero indicates that the event occurred at or close to the loop start location, and a value of one indicates that the event occurred at or close to the loop end location.

Locations of open circuit events can be determined in a similar manner. For an open circuit event, impedances at loop start and loop end locations are considered. Because the signal provided by amplifier 110 is alternating current, such impedances correspond with voltages at such locations. Accordingly, Equation 1 can be used to determine the location of open circuit events, as well as short circuit and overheat events. However, a controller can differentiate between, on the one hand, short circuit and overheat events, and, on the other hand, open circuit events, by considering the magnitude of a voltage potential between inner wire 106 and outer tube 104.

Using Equation 1 to determine event locations, as opposed to prior art techniques, has certain advantages. Some prior art techniques utilize Equation 2, below.

$$L = \frac{V_s}{V_s + V_e} \quad (2)$$

However, Equation 2 can produce erroneous results for events located near loop start location. Specifically, near the loop start location, e.g., the first 20% of the loop distance, the signal-to-noise ratio can be relatively small. This introduces significant error into prior art systems that utilize Equation 2. Equation 1 corrects for these types of errors by using the larger signal values of $V_e$ to mitigate the low signal-to-noise ratio near the loop start location.

A further technique disclosed herein can reduce errors attributed to internal circuit variations in the controller. That is, the controller includes electronic components that have associated error tolerance limits. Nevertheless, even of the components are within their specified tolerance values, the cumulative effect of such variations can cause the controller to have inaccurate readings for events, particularly those near the loop start and loop end locations. Near the loop end location, e.g., the last 20% of the distance, the loop signal might not be appropriately biased to achieve the full scale range of DC-to-digital converter 114. If the signal is under-driven, then it will not reach the full end range of scaler 116. If the signal is over-driven, then it will saturate DC-to-digital converter 114 even if the event is not near the end of the loop. Similar considerations apply to events near the loop start location.

To reduce errors attributed to internal circuit variations in the controller, some embodiments measure and store internal error information at a time of manufacture of the controller. The information can be stored in a non-volatile memory (e.g., flash memory) of the controller. The information can be determined by simulating events, e.g., short circuit events, once the relevant internal circuitry of the controller is installed, and measuring an output of the controller or controller components. The measurement can be of the outputs of any of, for example, AC-to-DC converter 112, DC-to-digital converter 114, or scaler 118. The measured values can be compared to the expected values, and the differences stored in non-volatile memory. Once stored, the controller can use the values as offsets, e.g., to output 118. Accordingly, this technique can ameliorate errors introduced by internal circuit variations in the controller.

A further technique disclosed herein can be used to correct for errors introduced by using a sub-optimal gain for the loop signal. Thus, for some embodiments, the technique includes programming the controller with information sufficient to select a loop signal gain for each connected loop. Each loop can have a different resistance, e.g., 10-100Ω. Accordingly, a different loop signal current can be used for each loop so that each loop provides appropriate values for $V_s$ and $V_e$ during an event, e.g., values sufficient to achieve a full range of values output by AC-to-DC converter 112. The controller can be programmed with values associated with each loop connected to the controller. Each value can be sufficient to specify a current, gain, or electrical bias to be utilized with the associated loop. These values can be stored in a non-volatile memory of the controller, e.g., a flash memory. In some embodiments, the loops to be used by a specific controller are known ahead of time, e.g., for controllers installed in aircraft. Thus, at the time of manufacture, for example, the controller can be programmed with values appropriate for the known loops. This technique improves upon prior art techniques that utilize a fixed set of gain values and assign individual gains based on measured resistance values. Such prior art techniques can fail to provide sufficiently fine-grained gain values to achieve a full range of output values.

A further technique disclosed herein can be used to reduce errors attributed to differences in installation parameters. For example, embodiments can be installed in an aircraft. In such embodiments, electrical connections between the sensing element and controller can be through wiring specific to the particular aircraft in which it is installed. The wiring in each aircraft is different, with different lengths and different corresponding resistances, for example. The loop signal gain should vary accordingly.

Thus, after installation, some embodiments can store values indicative of installation-specific variations and use such values as offsets. Such values can be stored in, e.g., nonvolatile memory of the controller, such as in a flash memory. Each value can be sufficient to specify a current, gain, or electrical bias to be utilized with the associated loop. In some embodiments, the controller can enter a calibration mode in order to discover and store the offset values. The calibration mode can simulate events at loop start and loop end locations for each attached loop. During such events, the controller can determine whether the data it gathers is indicative of accurate locations. If not, the controller can calculate an offset for each loop to account for differences in installation parameters and store such values as discussed. In response to an actual event, the controller can utilize the offset values to adjust its location data so as to improve its accuracy compared with prior art techniques that do not account for individual installation characteristics.

The foregoing description is illustrative, and variations in configuration and implementation may occur to persons skilled in the art. Other resources described as singular or integrated can in embodiments be plural or distributed, and resources described as multiple or distributed can in embodiments be combined. The scope of the present teachings is accordingly intended to be limited only by the following claims.

What is claimed is:

1. A system comprising:
a sensing element comprising an inner wire, a conductive outer tube, and a filler interposed between the inner wire and the conductive outer tube, wherein an electrical resistance of the filler lowers at a temperature indicative of an overheat event, wherein the sensing element comprises at least one of a loop start electrical connector and a loop end electrical connector; and
an electronic controller configured to electrically connect to at least one of the loop start electrical connector and to the loop end electrical connector, the electronic controller configured to store an internal offset value indicative of an error due to internal controller circuitry variances for at least one of a loop start reading and a loop end reading, wherein the electronic controller is configured to determine a relative location of an event in the sensing element using the internal offset value and the formula $$L = \frac{1}{2}[V_s/(V_s + V_e) + (1 - V_e/(V_s + V_e))],$$

where $V_s$ represents a voltage detected across the loop start electrical connector and $V_e$ represents a voltage detected across the loop end electrical connector.

2. The system of claim 1, wherein the electronic controller is configured to store a drive value associated with the sensing element, wherein the electronic controller is configured to provide to the sensing element a drive current having an amperage based on the drive value.

3. The system of claim 1, wherein the electronic controller is configured to determine an external offset value indicative of an error due to external circuitry variances for at least one of an induced loop start event and an induced loop end event, wherein the electronic controller is further configured to determine a relative location of an event in the sensing element using the external offset value.

4. The system of claim 1, further comprising a plurality of sensing elements connectable in series.

5. The system of claim 1, installed in an aircraft.

6. The system of claim 1, further configured to report overheat events, short circuit events, and open circuit events.

7. The system of claim 1, wherein the electronic controller further comprises a loop start port, a loop end port, and a multiplexer coupled to the loop start port and loop end port.

8. A system comprising:
a sensing element comprising an inner wire, a conductive outer tube, and a filler interposed between the inner wire and the conductive outer tube, wherein an electrical resistance of the filler lowers at a temperature indicative of an overheat event, wherein the sensing element comprises at least one of a loop start electrical connector and a loop end electrical connector; and
an electronic controller configured to electrically connect to at least one of the loop start electrical connector and to the loop end electrical connector, the electronic controller configured to store a drive value associated with the sensing element, wherein the electronic controller is configured to provide to the sensing element a drive current having an amperage based on the drive value, wherein the electronic controller is configured to determine a relative location of an event in the sensing element using the formula $$L = \frac{1}{2}[V_s/(V_s + V_e) + (1 - V_e/(V_s + V_e))],$$

where $V_s$ represents a voltage detected across the loop start electrical connector and $V_e$ represents a voltage detected across the loop end electrical connector.

9. The system of claim 8, wherein the controller is configured to store an external offset value indicative of an error due to external circuitry variances for at least one of an induced loop start event and an induced loop end event, wherein the electronic controller is configured to determine a relative location of an event in the sensing element using the external offset value.

10. The system of claim 8, wherein the electronic controller is configured to store an internal offset value indicative of an error due to internal controller circuitry variances for at least one of a loop start reading and a loop end reading, wherein the electronic controller is further configured to determine a relative location of an event in the sensing element using the internal offset value.

11. The system of claim 8, further comprising a plurality of sensing elements connectable in series.

12. The system of claim 8, installed in an aircraft.

13. The system of claim 8, further configured to report overheat events, short circuit events, and open circuit events.

14. The system of claim 8, wherein the electronic controller further comprises a loop start port, a loop end port, and a multiplexer coupled to the loop start port and loop end port.

15. A system comprising:
a sensing element comprising an inner wire, a conductive outer tube, and a filler interposed between the inner wire and the conductive outer tube, wherein an electrical resistance of the filler lowers at a temperature indicative of an overheat event, wherein the sensing element comprises at least one of a loop start electrical connector and a loop end electrical connector; and
an electronic controller configured to electrically connect to at least one of the loop start electrical connector and to the loop end electrical connector, the electronic controller configured to store a drive value associated with the sensing element and an internal offset value indicative of an error due to internal controller circuitry variances for at least one of a loop start reading and a loop end reading, wherein the electronic controller is configured to provide to the sensing element a drive current having an amperage based on the drive value, wherein the electronic controller is configured to determine a relative location of an event in the sensing element using the internal offset value.

16. The system of claim 15, wherein the controller is configured to store an external offset value indicative of an error due to external circuitry variances for at least one of an induced loop start event and an induced loop end event, wherein the electronic controller is further configured to determine a relative location of an event in the sensing element using the external offset value.

17. The system of claim 15, wherein the electronic controller is further configured to determine a relative location of an event in the sensing element using to internal offset value, the external offset value, and the formula $$L = \frac{1}{2}[V_s/(V_s + V_e) + (1 - V_e/(V_s + V_e))],$$

where $V_s$ represents a voltage detected across the loop start electrical connector and $V_e$ represents a voltage detected across the loop end electrical connector.

18. The system of claim 15, further comprising a plurality of sensing elements connectable in series.

19. The system of claim 15, installed in an aircraft.

20. The system of claim 15, further configured to report overheat events, short circuit events, and open circuit events.

21. The system of claim 15, wherein the electronic controller further comprises a loop start port, a loop end port, and a multiplexer coupled to the loop start port and loop end port.

* * * * *